(12) United States Patent
Jeong

(10) Patent No.: US 9,991,240 B2
(45) Date of Patent: Jun. 5, 2018

(54) DISPLAY APPARATUS AND METHOD OF MANUFACTURING THE SAME

(71) Applicant: SAMSUNG DISPLAY CO., LTD., Yongin-si, Gyeonggi-do (KR)

(72) Inventor: Changyong Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/483,159

(22) Filed: Apr. 10, 2017

(65) Prior Publication Data
US 2017/0294424 A1 Oct. 12, 2017

(30) Foreign Application Priority Data
Apr. 8, 2016 (KR) .................. 10-2016-0043502

(51) Int. Cl.
| | |
|---|---|
| *H01L 29/18* | (2006.01) |
| *H01L 33/00* | (2010.01) |
| *H01L 25/16* | (2006.01) |
| *H01L 25/00* | (2006.01) |
| *H01L 33/58* | (2010.01) |
| *H01L 33/62* | (2010.01) |
| *H01L 25/075* | (2006.01) |
| *H01L 33/40* | (2010.01) |

(52) U.S. Cl.
CPC ........ *H01L 25/167* (2013.01); *H01L 25/0753* (2013.01); *H01L 25/50* (2013.01); *H01L 33/58* (2013.01); *H01L 33/62* (2013.01); *H01L 33/0095* (2013.01); *H01L 33/40* (2013.01); *H01L 2933/0016* (2013.01); *H01L 2933/0058* (2013.01)

(58) Field of Classification Search
CPC ... H01L 25/167; H01L 25/0753; H01L 25/50; H01L 33/62; H01L 33/58; H01L 2933/0058; H01L 2933/0016; H01L 33/40; H01L 33/0095
See application file for complete search history.

(56) References Cited

U.S. PATENT DOCUMENTS

| | | |
|---|---|---|
| 6,204,079 B1 | 3/2001 | Aspar et al. |
| 6,763,581 B2 | 7/2004 | Hirai |
| 7,195,687 B2 | 3/2007 | Hayashi et al. |

(Continued)

FOREIGN PATENT DOCUMENTS

| | | |
|---|---|---|
| JP | 2002314052 A | 10/2002 |
| KR | 1020020024771 A | 4/2002 |

(Continued)

*Primary Examiner* — Victor A Mandala
(74) *Attorney, Agent, or Firm* — Cantor Colburn LLP

(57) ABSTRACT

A display apparatus includes: a display substrate; a light-emitting diode ("LED") disposed on the display substrate and which emits light; a passivation layer disposed on the display substrate and surrounding the LED; a first conductive layer disposed on the LED and the passivation layer; and a capping layer disposed on the LED and which adjusts a proceeding path of light emitted from the LED, where the first conductive layer includes a first region which overlaps the capping layer and a second region which does not overlap the capping layer, and the first region and the second region of the first conductive layer have different light characteristics from each other.

16 Claims, 11 Drawing Sheets

(56) References Cited

U.S. PATENT DOCUMENTS

| | | | |
|---|---|---|---|
| 8,981,396 B2 * | 3/2015 | Lee | H01L 33/08 257/93 |
| 2002/0096994 A1 | 7/2002 | Iwafuchi et al. | |
| 2003/0087476 A1 | 5/2003 | Oohata et al. | |
| 2007/0252266 A1 | 11/2007 | Koo et al. | |
| 2012/0249776 A1 | 10/2012 | Ji et al. | |
| 2013/0285086 A1 | 10/2013 | Hu et al. | |
| 2014/0120640 A1 | 5/2014 | Shieh et al. | |
| 2015/0008937 A1 | 1/2015 | Lee et al. | |
| 2015/0144973 A1 * | 5/2015 | Anzai | G06F 1/32 257/88 |
| 2015/0318334 A1 * | 11/2015 | Kim | H01L 27/3213 257/40 |
| 2017/0243931 A1 * | 8/2017 | Kim | H01L 27/3218 |

FOREIGN PATENT DOCUMENTS

| | | |
|---|---|---|
| KR | 1020050005688 A | 1/2005 |
| KR | 1020050091161 A | 9/2005 |
| KR | 1020100010961 A | 2/2010 |
| KR | 1020100018001 A | 2/2010 |
| KR | 1020120080773 A | 7/2012 |
| KR | 101182822 B1 | 9/2012 |
| KR | 1020150005375 A | 1/2015 |

* cited by examiner

DISPLAY APPARATUS AND METHOD OF MANUFACTURING THE SAME

This application claims priority to Korean Patent Application No. 10-2016-0043502, filed on Apr. 8, 2016, and all the benefits accruing therefrom under 35 U.S.C. §119, the content of which in its entirety is herein incorporated by reference.

BACKGROUND

1. Field

One or more embodiments relate to a display apparatus and a method of manufacturing the display apparatus.

2. Description of the Related Art

Light-emitting diodes ("LED"s) are semiconductor devices in which, when a voltage is applied to a PN junction diode in a forward direction, holes and electrons are injected and energy generated by the re-combination of the holes and the electrons is converted into light energy.

The LEDs may be classified into inorganic LEDs and organic LEDs, and are widely used in various fields including small electronic devices, such as mobile phones, and large televisions ("TVs") in addition to backlights, illumination devices, electronic displays for liquid crystal display ("LCD") TVs.

SUMMARY

One or more embodiments are directed to a display apparatus that may reduce emission of undesired light, and a method of manufacturing the display apparatus.

One or more embodiments are directed to a display apparatus that may check whether a light-emitting diode ("LED") is properly mounted, in real-time.

One or more embodiments include a method of manufacturing a display apparatus, in which some of a plurality of LEDs may be selectively transferred.

According to one or more embodiments, a display apparatus includes: a display substrate; an LED disposed on the display substrate, where the LED emits light; a passivation layer disposed on the display substrate and surrounding the LED; a first conductive layer disposed on the LED and the passivation layer; and a capping layer disposed on the LED, where the capping layer adjusts a proceeding path of light emitted from the LED. In such an embodiment, the first conductive layer may include a first region which overlaps the capping layer and a second region which does not overlap the capping layer, and the first region and the second region of the first conductive layer may have different light characteristics from each other.

In an embodiment, the first region and the second region may include metal atoms and oxygen atoms.

In an embodiment, the first region and the second region may include the same atoms as each other, and compositions of the same atoms of the first region and the second region may be different from each other.

In an embodiment, a specific gravity of the oxygen atoms included in the first region may be different from a specific gravity of the oxygen atoms included in the second region.

In an embodiment, a specific gravity of the oxygen atoms included in the first region may be greater than a specific gravity of the oxygen atoms included in the second region.

In an embodiment, incident light may be absorbed in the second region.

In an embodiment, incident light may be transmitted through the first region.

In an embodiment, the first conductive layer may be an electrode which applies an electrical signal to the LED.

In an embodiment, the capping layer may have a lens shape.

In an embodiment, the display apparatus may further include an insulating member contacting the LED and protruding toward the display substrate.

In an embodiment, the display substrate may include a dent portion having a dent region corresponding to the insulating member.

In an embodiment, the display substrate may further include a second conductive layer disposed on the display substrate, where the second conductive layer is cut by the insulating member.

In an embodiment, a partial region of the second conductive layer may be disposed on the dent portion.

In an embodiment, the LED may further include an electrode pad spaced apart from the insulating member.

In an embodiment, the second conductive layer may contact the electrode pad.

In an embodiment, the LED may include a P—N diode, and the insulating member may contact a partial region of the P—N diode.

According to one or more embodiments, a method of manufacturing a display apparatus, includes: preparing a first substrate on which first through third sacrificial layers are sequentially disposed to be spaced apart from one another; arranging first through third LEDs on the first through third sacrificial layers, respectively; disposing a second substrate on the first substrate in a state in which the first through third LEDs are arranged between the second substrate and the first substrate; and selectively adhering the first LED and the second LED of the first through third LEDs to the second substrate using a laser.

In an embodiment, the first sacrificial layer and the second sacrificial layer may have different absorption coefficients with respect to the laser, and the first sacrificial layer and the third sacrificial layer may have the same absorption coefficients with respect to the laser.

In an embodiment, the laser may be irradiated entirely onto the first substrate.

In an embodiment, the first sacrificial layer and the third sacrificial layer may include a material which is melted by the laser.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
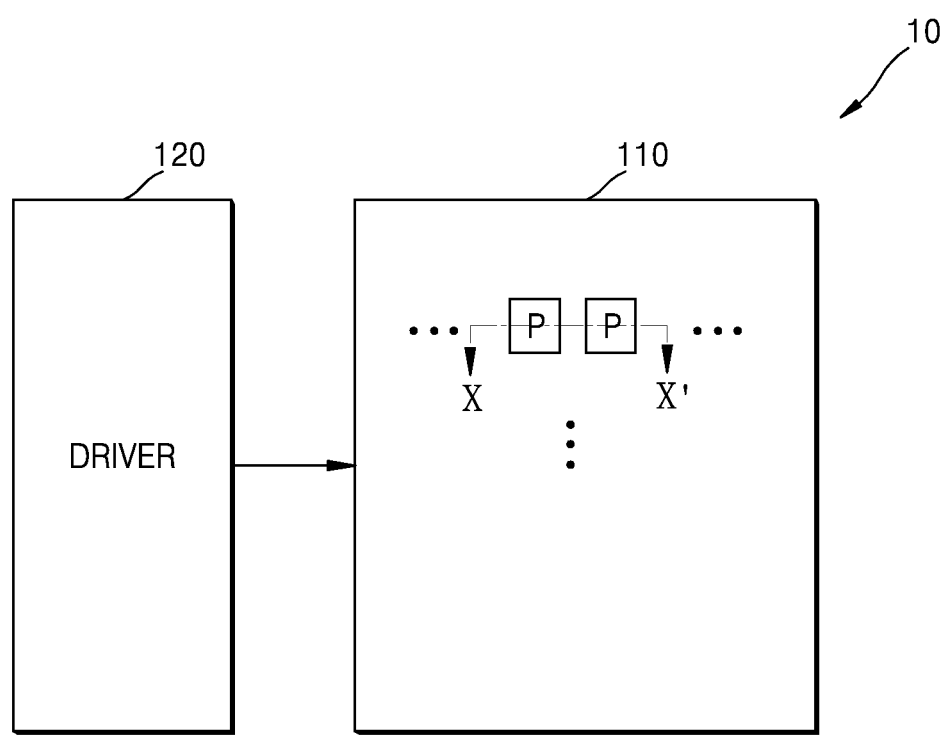
FIG. 1 is a plan view schematically illustrating a display apparatus according to an embodiment.

The present disclosure may include various embodiments and modifications, and embodiments thereof will be illustrated in the drawings and will be described herein in detail. The advantages and features of the present disclosure and methods of achieving the advantages and features will be described more fully with reference to the accompanying drawings, in which embodiments of the present disclosure are shown. The present disclosure may, however, be embodied in many different forms and should not be construed as being limited to the embodiments set forth herein.

Reference will now be made in detail to embodiments, examples of which are illustrated in the accompanying drawings. In the drawings, the same elements are denoted by the same reference numerals, and a repeated explanation thereof will not be given.

It will be understood that although the terms "first", "second", etc. may be used herein to describe various elements, these elements should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

As used herein, the singular forms "a", "an", and "the" are intended to include the plural forms as well, unless the context clearly indicates otherwise.

"Or" means "and/or." As used herein, the term "and/or" includes any and all combinations of one or more of the associated listed items. Expressions such as "at least one of" when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or element is referred to as being "on", another layer, region, or element, it can be directly or indirectly on the other layer, region, or element. That is, for example, intervening layers, regions, or elements may be present.

Sizes of elements may be exaggerated for convenience of explanation. In other words, since sizes and thicknesses of elements in the drawings are arbitrarily illustrated for convenience of explanation, the following embodiments are not limited thereto.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. The term "on" or "under" refers to a top or bottom of a target in the drawings, and does not necessarily mean the top or bottom of the target in a direction of gravity.

Hereinafter, exemplary embodiments of the invention will be described in detail with reference to the accompanying drawings FIG. 1 is a plan view of a display apparatus 10 according to an embodiment.

Referring to FIG. 1, an embodiment of the display apparatus 10 may include a display portion 110 and a driver 120. The display portion 110 may include a plurality of pixels P that are arranged substantially in a matrix form on a substrate thereof, e.g., a base substrate. The driver 120 may include a scan driver that applies a scan signal to a scan line connected to the pixels P and a data driver that applies a data signal to a data line connected to the pixels P. The driver 120 may be disposed on a non-display portion of the substrate around the display portion 110 in which the pixels P are defined. The driver 120 may be formed as an integrated circuit chip and may be directly mounted on a base substrate on which the plurality of pixels P is formed. In an embodiment, the driver 120, may be mounted on a flexible printed circuit film, may be attached as a tape carrier package ("TCP") to the substrate, or may be directly formed on the substrate.

Figure 2:
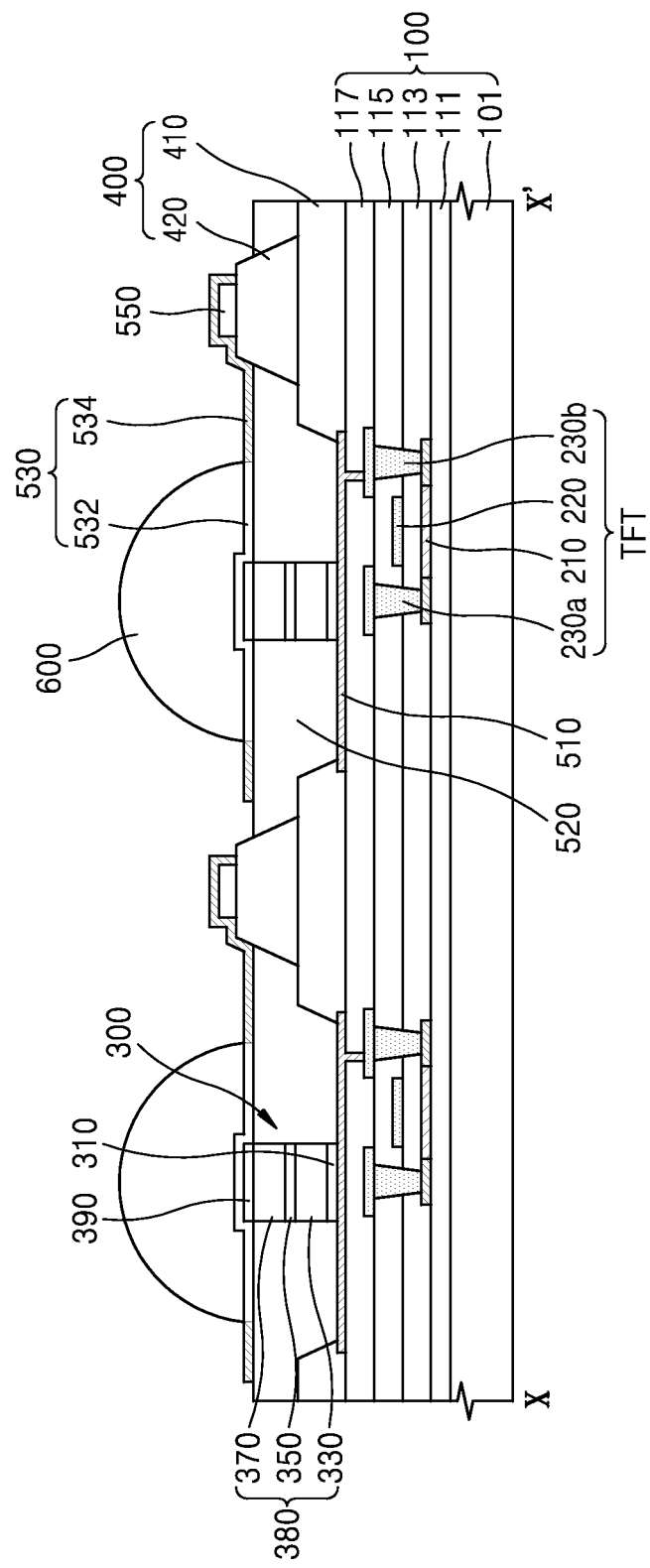
FIG. 2 is a cross-sectional view taken along line X-X' of the display apparatus illustrated in FIG. 1.

FIG. 2 is a cross-sectional view taken along line X-X' of the display apparatus 10 illustrated in FIG. 1.

Referring to FIG. 2 together with FIG. 1, an embodiment of the display apparatus 10 may include a display substrate 100 and a light-emitting diode ("LED") 300 on the display substrate 100. In such an embodiment, the display apparatus 10 may include the driver 120 that applies signals to the plurality of pixels P arranged in a matrix form in the display portion 110 of the display substrate 100.

The driver 120 may include a scan driver that applies a scan signal to a scan line connected to the pixels P and a data driver that applies a data signal to a data line connected to the pixels P. The driver 120 may be disposed on a non-display portion of the base substrate around the display portion 110 including the pixels P. The driver 120 may be formed as an integrated circuit chip, and may be directly mounted on a base substrate on which the plurality of pixels P is formed, may be mounted on a flexible printed circuit film, may be attached as a TCP to the base substrate, or may be directly formed on the base substrate.

The display substrate 100 may include a base substrate 101, a thin film transistor ("TFT") on the base substrate 101, and a planarization layer 117 on the TFT, and a first electrode 510 connected to the TFT through a via hole may be disposed on the planarization layer 117.

The base substrate 101 may include any of various materials. In one embodiment, for example, the base substrate 101 may be formed of a transparent glass material having $SiO_2$ as a main component. However, the base substrate 101 is not limited thereto, and may include or be formed of a transparent plastic material and may be flexible. The transparent plastic material may be an insulating organic material including at least one of polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide, polycarbonate ("PC"), cellulose triacetate ("TAC"), and cellulose acetate propionate ("CAP").

In an embodiment, where the display apparatus 10 is a bottom emission-type display apparatus in which an image is displayed toward the base substrate 101, the base substrate 101 is formed of a transparent material. In an alternative embodiment, where the display apparatus 10 is a top emission-type display apparatus in which an image is displayed away from the base substrate 101, the base substrate 101 may not need to include a transparent material. In such an embodiment, the base substrate 101 may include a metal.

In such an embodiment, where the base substrate 101 is formed of a metal, the base substrate 101 may include at least one of, but not limited to, iron, chromium, manganese, nickel, titanium, molybdenum, stainless steel ("SUS"), an Invar alloy, an Inconel alloy, and a Kovar alloy.

In an embodiment, a buffer layer 111 may be disposed on the base substrate 101. The buffer layer 111 may planarize a top surface of the base substrate 101 and may effectively prevent impurities or moisture from penetrating from the base substrate 101. In one embodiment, for example, the buffer layer 111 may include an inorganic material, such as silicon oxide, silicon nitride, silicon oxynitride, aluminum oxide, aluminum nitride, titanium oxide or titanium nitride, or an organic material, such as polyimide, polyester or acryl, and may be provided or formed by stacking such an inorganic or organic material.

The TFT may include an active layer 210, a gate electrode 220, a source electrode 230a, and a drain electrode 230b.

In an embodiment, as shown in FIG. 2, the TFT may be a top gate-type TFT in which the active layer 210, the gate electrode 220, the source electrode 230a and the drain electrode 230b are sequentially disposed on one another. However, embodiments are not limited thereto, and various types of TFTs including a bottom gate type may be employed.

The active layer 210 may include a semiconductor material, for example, amorphous silicon or polycrystalline silicon. However, embodiments are not limited thereto, and the active layer 210 may include various materials. In an alternative embodiment, the active layer 210 may include an organic semiconductor material, for example.

In another alternative embodiment, the active layer 210 may include an oxide semiconductor material. In one embodiment, for example, the active layer 210 may include an oxide of a material selected from metal elements in Groups 12, 13, and 14, such as zinc (Zn), indium (In), gallium (Ga), tin (Sn), cadmium (Cd), germanium (Ge), or a combination thereof.

A gate insulating layer 113 is disposed on the active layer 210. The gate insulating layer 113 insulates the active layer 210 and the gate electrode 220 from each other. The gate insulating layer 113 may include a plurality of layers or a single layer. The gate insulating layer 113 may include a film including an inorganic material, such as silicon oxide and/or silicon nitride.

The gate electrode 220 is disposed on the gate insulating layer 113. The gate electrode 220 may be connected to a gate line (not shown) that applies an on/off signal to the TFT.

The gate electrode 220 may include or be formed of a low-resistivity metal material. The gate electrode 220 may include a single layer or layers including at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example, in consideration of adhesion to an adjacent layer, surface flatness of a stacked layer, and processability.

An interlayer insulating layer 115 is disposed on the gate electrode 220. The interlayer insulating layer 115 insulates the source electrode 230a, the drain electrode 230b, and the gate electrode 220. The interlayer insulating layer 115 may include a plurality of layers or a single layer. The interlayer insulating layer 115 may include a film including an inorganic material. In an embodiment, the inorganic material may be a metal oxide or a metal nitride. In one embodiment, for example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The source electrode 230a and the drain electrode 230b are disposed above the interlayer insulating layer 115. The source electrode 230a and the drain electrode 230b may include a single layer or layers formed of at least one material selected from Al, Pt, Pd, Ag, Mg, Au, Ni, Nd, Ir, Cr, Li, Ca, Mo, Ti, W, and Cu. The source electrode 230a and the drain electrode 230b are electrically connected to a source region and a drain region of the active layer 210, respectively.

The planarization layer 117 is disposed on the TFT. The planarization layer 117 covers the TFT, relieves a step height due to the TFT, and planarizes a top surface of the TFT.

The planarization layer 117 may include a single layer or a plurality of layers, each of which may include a film including an organic material. The organic material may include a commonly-used polymer, such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. In such an embodiment, the planarization layer 117 may include a composite stacked layer of an inorganic insulating layer and an organic insulating layer.

The first electrode 510 is disposed on the planarization layer 117. The first electrode 510 may be electrically connected to the TFT. In an embodiment, the first electrode 510 may be electrically connected to the drain electrode 230b via a contact hole defined in the planarization layer 117. The first electrode 510 may have a shape that may be variously modified. In an embodiment, the first electrode 510 may be provided by being patterned in an island shape, for example.

A bank layer 400 may be disposed on the planarization layer 117 and define a pixel region. The bank layer 400 may include a concave portion in which each of LEDs 300 may be accommodated. The bank layer 400 may include a first bank layer 410 that constitutes the concave portion, for example. The height of the first bank layer 410 may be determined by the height of each of the LEDs 300 and an angle of view. The size (e.g., the width) of the concave portion may be determined by the resolution of the display apparatus 10 and a pixel density, for example. In one embodiment, for example, the height of each of the LEDs 300 may be greater than the height of the first bank layer 410. In an embodiment, as shown in FIG. 2, the concave portion has a rectangular shape. However, embodiments are not limited thereto, and the concave portion may have one of various shapes including a polygonal shape, a rectangular shape, a circular shape, a conical shape, an oval shape and a triangular shape, for example.

The bank layer 400 may further include a second bank layer 420 disposed on the first bank layer 410. The first bank layer 410 and the second bank layer 420 may have a step height, and the width of the second bank layer 420 may be less than the width of the first bank layer 410. A conductive layer 550 may be disposed on the second bank layer 420. The conductive layer 550 may extend in a direction parallel to the data line or the scan line and is electrically connected to a second electrode 530.

Figure 4:
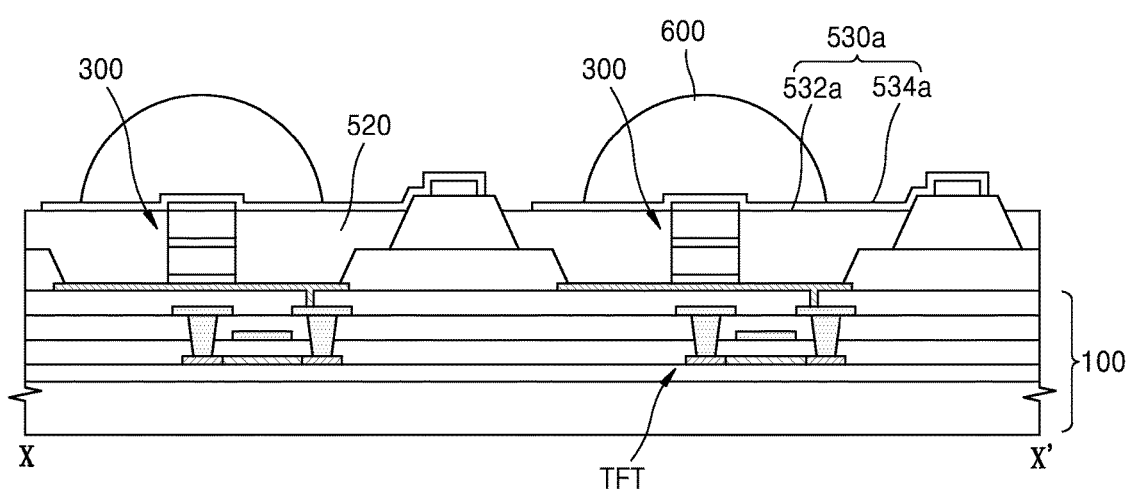

However, embodiments are not limited thereto, and the second bank layer 420 may be omitted, and the conductive layer 550 may be disposed on the first bank layer 410. Alternatively, as illustrated in FIG. 4, the second bank layer 420 and the conductive layer 550 may be omitted, and the second electrode 530 may include a common electrode that is commonly provided in the pixels P on the entire surface of the base substrate 101.

The first bank layer 410 and the second bank layer 420 may include a material that absorbs at least a part of light, a light-reflection material, or a light-scattering material. The first bank layer 410 and the second bank layer 420 may include a semi-transparent or opaque insulating material with respect to visible light, for example, light having a wavelength of about 380 nanometers (nm) to about 750 nm.

In one example, for example, the first bank layer 410 and the second bank layer 420 may include or be formed of PC, PET, PES, polyvinyl butyral, polyphenylether, polyamide, polyether imide, thermoplastic resin such as norbornene system resin, methacryl resin, or cyclic polyolefin, thermosetting resin, such as epoxy resin, phenol resin, urethane resin, acryl resin, vinyl ester resin, imide-based resin, urethane-based resin, urea resin, or melamine resin, or an organic insulating material, such as polystyrene, polyacrylonitrile, or PC. However, embodiments are not limited thereto.

In an alternative embodiment, the first bank layer 410 and the second bank layer 420 may include or be formed of an insulating inorganic material, such as inorganic oxide, such as SiOx, SiNx, SiNxOy, AlOx, TiOx, TaOx, or ZnOx, and inorganic nitride. However, embodiments are not limited thereto. In one embodiment, for example, the first bank layer 410 and the second bank layer 420 may include or be formed of an opaque material, such as a black matrix material.

In such an embodiment, an insulating black matrix material may include organic resin, resin or paste including a glass paste and a black pigment, metal particles, such as nickel, aluminum, molybdenum and an alloy thereof, metal oxide particles (for example, chromium oxide), or metal nitride particles (for example, chromium nitride). In an alternative embodiment, the first bank layer 410 and the second bank layer 420 may be a distributed Brag reflector ("DBR") having high reflexibility or a mirror reflector including a metal.

Each of the LEDs 300 is disposed in the concave portion. Each of the LEDs 300 may be electrically connected to the first electrode 510 in the concave portion.

Each of the LEDs 300 emits ultraviolet ("UV") rays or light having a red, green or blue wavelength, and may emit white light by using a fluorescent material or combining colors. In an embodiment, each of the LEDs 300 may be a micro LED. In such an embodiment, the micro LED may specify a size in a range of about 1 μm to about 100 μm. However, embodiments are not limited thereto, and the LEDs 300 may be an LED having a greater or smaller size than that of the micro LED. One LED 300 or a plurality of LEDs 300 may be picked up from a wafer using a transfer mechanism, transferred to the base substrate 101, and thus may be accommodated in the concave portion of the base substrate 101.

Each of the LEDs 300 may include a p-n diode 380, a first contact electrode 310 disposed on a side, e.g., a lower side, of the p-n diode 380, and a second contact electrode 390 disposed on an opposite side, e.g., an upper side, to the first contact electrode 310.

The p-n diode 380 may include a first semiconductor layer 330, a second semiconductor layer 370, and an intermediate layer 350 between the first semiconductor layer 330 and the second semiconductor layer 370.

The first semiconductor layer 330 may include a p-type semiconductor layer, for example. The p-type semiconductor layer may include or be formed of a semiconductor material having a composition formula of $In_xAl_yGa_{1-x-y}N$ ($0 \le x \le 1$, $0 \le y \le 1$, $0 \le x+y \le 1$), or at least one selected from GaN, AlN, AlGaN, InGaN, InN, InAlGaN and AlInN, for example, and may be doped with a p-type dopant, such as Mg, Zn, Ca, Sr or Ba. The first contact electrode 310 may be disposed on the first semiconductor layer 330.

The second semiconductor layer 370 may include an n-type semiconductor layer, for example. The n-type semiconductor layer may include or be formed of a semiconductor material having a composition formula of $In_xAl_yGa_{1-x-y}N$ ($0 \le x \le 1$, $0 \le y \le 1$, $0 \le x+y \le 1$) or at least one selected from GaN, AlN, AlGaN, InGaN, InN, InAlGaN and AlInN, for example, and may be doped with an n-type dopant, such as Si, Ge, or Sn. The second contact electrode 390 may be disposed on the second semiconductor layer 370.

However, embodiments are not limited thereto. In an alternative embodiment, the first semiconductor layer 330 may include an n-type semiconductor layer, and the second semiconductor layer 370 may include a p-type semiconductor layer.

The intermediate layer 350, in which electrons and holes re-combine with each other, may transit to a low energy level as the electrons and the holes re-combine with each other, and may generate light having a wavelength corresponding to a low energy level. The intermediate layer 350 may include be formed of a semiconductor material having a composition formula of $In_xAl_yGa_{1-x-y}N$ ($0 \le x \le 1$, $0 \le y \le 1$, $0 \le x+y \le 1$), for example, and may have a single quantum well ("SQW") or multi quantum well ("MQW") structure. In an embodiment, the intermediate layer 350 may include a quantum wire or quantum dot structure.

The first contact electrode 310 and/or the second contact electrode 390 may include at least one layer, and may include at least one of various conductive materials including a metal, a conductive oxide, and conductive polymers. The first contact electrode 310 may contact the first electrode 510, and the second contact electrode 390 may contact the second electrode 530.

The first electrode 510 may include a reflective layer including Ag, Mg, Al, Pt, Pd, Au, Ni, Nd, Ir, Cr and a compound thereof, and a transparent or semi-transparent electrode layer disposed on the reflective layer. The transparent or semi-transparent electrode layer may include at least one selected from indium tin oxide ("ITO"), indium zinc oxide ("IZO"), zinc oxide (ZnO), indium oxide (In$_2$O$_3$), indium gallium oxide ("IGO"), and aluminum zinc oxide ("AZO").

A passivation layer 520 surrounds each of the LEDs 300 in the concave portion. The passivation layer 520 fills a space between the bank layer 400 and the LED 300, thereby covering the concave portion and the first electrode 510. The passivation layer 520 may include or be formed of an insulating organic material. In one embodiment, for example, the passivation layer 520 may include or be formed of acryl, PMMA, benzocyclobutene ("BCB"), polyimide, acrylate, epoxy, and polyester. However, embodiments are not limited thereto.

The passivation layer 520 is disposed on an upper portion of the LED 300, for example, and may have a height determined not to cover the second contact electrode 390, such that the second contact electrode 390 is exposed. The second electrode 530 may be disposed on the passivation layer 520 and may be electrically connected to the exposed second contact electrode 390 of the LED 300.

The second electrode 530 may be disposed on the LED 300 and the passivation layer 520. The second electrode 530 may include or be formed of a transparent conductive material, such as ITO, IZO, ZnO or In$_2$O$_3$, and although an entire region of the second electrode 530 includes the same atoms, compositions of atoms may be different according to regions. The second electrode 530 will be described later in greater detail. The second electrode 530 is described as an electrode in a sense that a voltage is applied to the LED 300, and may be combined with a conductive layer later.

In an embodiment, the display apparatus 10 may further include a capping layer 600 that covers the LED 300. The capping layer 600 may be formed of a transparent polymer, such as epoxy, silicon, or urethane. In one embodiment, for example, the capping layer 600 may include at least one of thermoplastic or thermosetting resin, for example, acryl-based resin, such as polymethylmethacrylate, polyhydroxyethylmethacrylate or polycyclohexylmethacrylate, allyl-based resin such as polydiethyleneglycol bisallylcarbonate or PC, methacryl resin, polyurethane-based resin, polyester-based resin, polyvinyl chloride-based resin, polyvinyl acetate-based resin, cellulose-based resin, polyamide-based resin, fluorine-based resin, polypropylene-based resin or polystyrene-based resin, or a mixed material thereof.

The capping layer 600 may include or be formed of a material having a refractive index that is greater than about 1. A material of the capping layer 600 may be selected to allow the refractive index (denoted by n_lens) of the capping layer 600, a refractive index (denoted by n_LED) of the LED 300 and a refractive index (denoted by n_air) of air to satisfy the following relationship: n_air<n_lens<n_LED. In an embodiment, by adding the capping layer 600, a difference in refractive indices is reduced at an interface between the LED 300 and air, such that a light loss from the LED 300 to air may be reduced. The capping layer 600 may have a lens shape.

In an embodiment, each of the LEDs 300 included in the display apparatus 10 may emit a predetermined color. In one embodiment, for example, the display apparatus 10 may include a pixel including an LED that emits red light, a pixel including an LED that emits green light, and a pixel including an LED that emits blue light. Alternatively, the display apparatus 10 may further include a pixel including an LED that emits white light. In such an embodiment, the LEDs emit lights having different wavelength bands, such that there may be a difference in light distribution according to wavelengths of lights. Thus, shift of white light may occur.

In such an embodiment, the display apparatus 10 may employ the capping layer 600 having different light characteristics according to emitted lights to reduce shift of white light. In one embodiment, for example, the display apparatus 10 may include a capping layer having different curvature radii (or radii of curvature) according to emitted lights. The display apparatus 10 may include a red pixel PR that emits red light, a green pixel PG that emits green light, and a blue pixel PB that emits blue light. The red pixel PR of the display apparatus 10 may include a first capping layer having a first curvature radius (or a first radius of curvature), and the green pixel PG may include a second capping layer having a second curvature radius (or a second radius of curvature), and the blue pixel PB may include a third capping layer having a third curvature radius (or a third radius of curvature).

As a wavelength is reduced, a refractive angle increases at an interface of a medium. Thus, in an embodiment, a capping layer may have a curvature radius that is in reverse proportion to wavelength to reduce a degree of refraction between pixels. In one embodiment, for example, because red light has a greater wavelength than that of green light, the first curvature radius may be greater than the second curvature radius. In such an embodiment, because green light has a greater wavelength than that of blue light, the second curvature radius may be greater than the third curvature radius.

In an embodiment, the bank layer 400 may absorb light emitted from the LED 300 to effectively prevent light from being emitted to the outside or mixture of neighboring lights. The display apparatus 10 may remove undesired light, such as light caused by diffused reflection, using the second electrode 530 in addition to the bank layer 400. The second electrode 530 may be divided into a first region 532 that overlaps the capping layer and a second region 534 that does not overlap the capping layer. The first region 532 and the second region 534 may have different light characteristics from each other. In one embodiment, for example, the first region 532 may include or be formed of a material through which light transmits, to emit light emitted from the LED 300 to the outside, and the second region 534 may include or be formed of a material that absorbs light to effectively prevent light emitted from the LED 300 from being emitted to the outside or to cut off externally-incident light.

The first region 532 and the second region 534 of the second electrode 530 may include the same atoms as each other, and compositions of the same atoms in the first region 532 and the second region 534 of the second electrode 530 may be different from each other. The second electrode 530 includes metal atoms and oxygen atoms, and a specific gravity of the oxygen atoms included in the first region 532 may be different from a specific gravity of the oxygen atoms included in the second region 534. In one embodiment, for example, the specific gravity of the oxygen atoms included in the first region 532 may be greater than the specific gravity of the oxygen atoms included in the second region 534. Thus, the first region 532 may have light transmittance, and the second region 534 may have a light absorption property due to the nature of metal. The second electrode 530 may apply a common voltage to the LED 300.

In an embodiment, as described above, the second electrode 530 that is a single layer has different light characteristics according to regions so that desired light may be emitted to the outside and undesired light may be effectively prevented from being emitted to the outside. The above-described light characteristics may be implemented with an ion sputtering process.

In an embodiment, oxygen atoms of a region of a transparent metal oxide that does not overlap the capping layer after the transparent metal oxide is provided or formed on a display substrate during a manufacturing process of the display apparatus, are removed by ion sputtering such that the specific gravity of the oxygen atoms of the second region 534 may be reduced and the specific gravity of the metal atoms of the second region 534 may be increased.

FIGS. 3 through 6 are cross-sectional views for showing a process of manufacturing the display apparatus 10 according to an embodiment.

Figure 3:
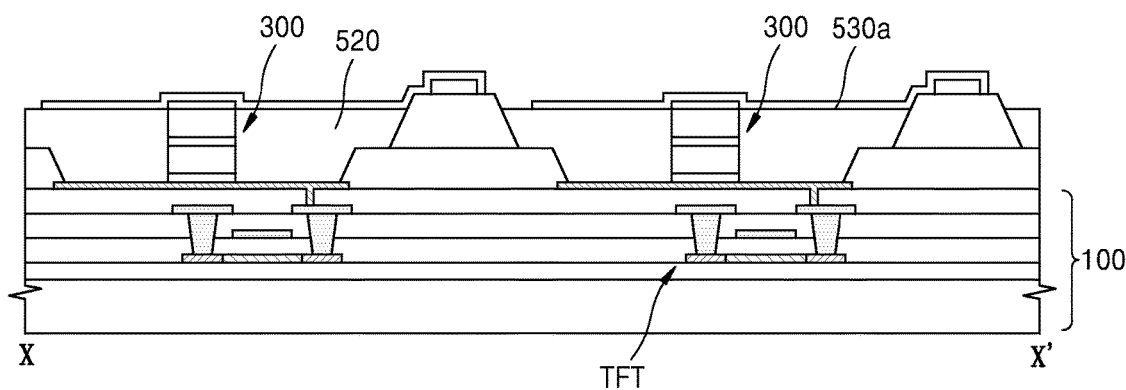
FIGS. 3 through 6 are cross-sectional views showing a process of manufacturing a display apparatus, according to an embodiment.

In an embodiment, as illustrated in FIG. 3, the display substrate 100 on which the LED 300, the passivation layer 520 and a conductive layer 530*a* are stacked, may be prepared. The conductive layer 530*a* may include or be formed of a transparent metal oxide. In such an embodiment, as illustrated in FIG. 4, the capping layer 600 may be provided or formed on a partial region of the conductive layer 530*a*. At least a portion of the partial region of the capping layer 600 may overlap the LED 300. Thus, the conductive layer 530*a* may be divided into a first region 532*a* that overlaps the capping layer 600, and a second region 534*a* that does not overlap the capping layer 600.

Figure 5:
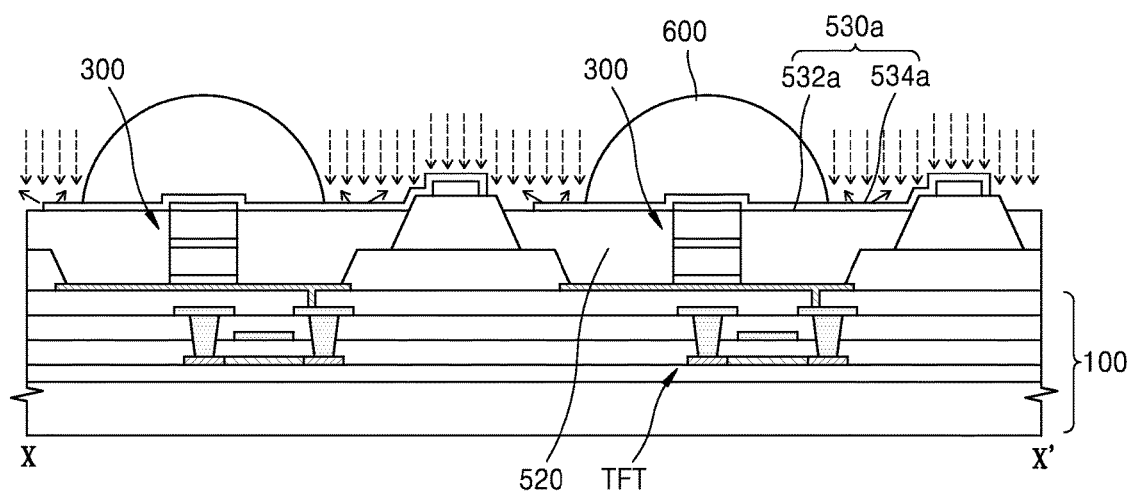

In an embodiment, as illustrated in FIG. 5, oxygen atoms may escape from the partial region of the conductive layer 530*a* by ion sputtering. Particles used in ion sputtering may be particles that do not undergo a chemical reaction with materials provided below a conductive layer. In one embodiment, for example, the particles may be argon, nitrogen, etc.

Figure 6:
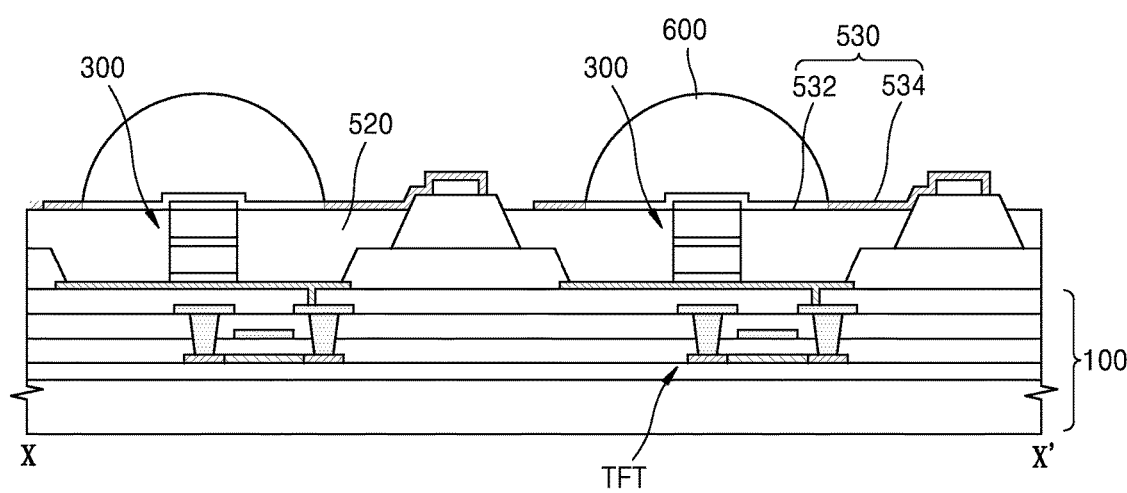

The oxygen atoms included in the first region 532*a* of the conductive layer 530*a* that overlaps the capping layer 600 during ion sputtering, do not react with ion particles. However, in the second region 534*a* that does not overlap the capping layer 600, the oxygen atoms may escape from the conductive layer 530*a* due to the sputtered particles. A region, in which the oxygen atoms escape from the conductive layer 530*a*, may include a conductive oxide having changed compositions of the oxygen atoms and a mixture of metal and the conductive oxide. Thus, as illustrated in FIG. 6, as oxygen escapes from the second region 534, inherent characteristics of the metal are exhibited such that the second region 534 has a light absorption property.

In an embodiment, the display apparatus 10 may be a top emission-type display apparatus, but not being limited thereto. In an alternative embodiment, the display apparatus 10 may be a bottom emission-type display apparatus in which light emitted from a light-emitting device is emitted to the substrate. In such an embodiment, the first electrode may be a transparent or semi-transparent electrode, and the second electrode may be a reflective electrode. In an embodiment, the display apparatus 10 may be a dual emission-type display apparatus in which light is emitted in both directions including forward and backward directions.

In an embodiment, as described above, the display apparatus 10 may include a vertical-type LED 300, in which the first contact electrode 310 and the second contact electrode 390 are disposed on opposite sides. However, embodiments are not limited thereto. In an alternative embodiment, the LED 300 may be a horizontal-type or flip-type light-emitting device in which the first contact electrode 310 and the second contact electrode 390 are disposed in the same direction. In such an embodiment, positions of the first electrode 510 and the second electrode 530 may correspond to positions of the first contact electrode 310 and the second contact electrode 390.

Figure 7:
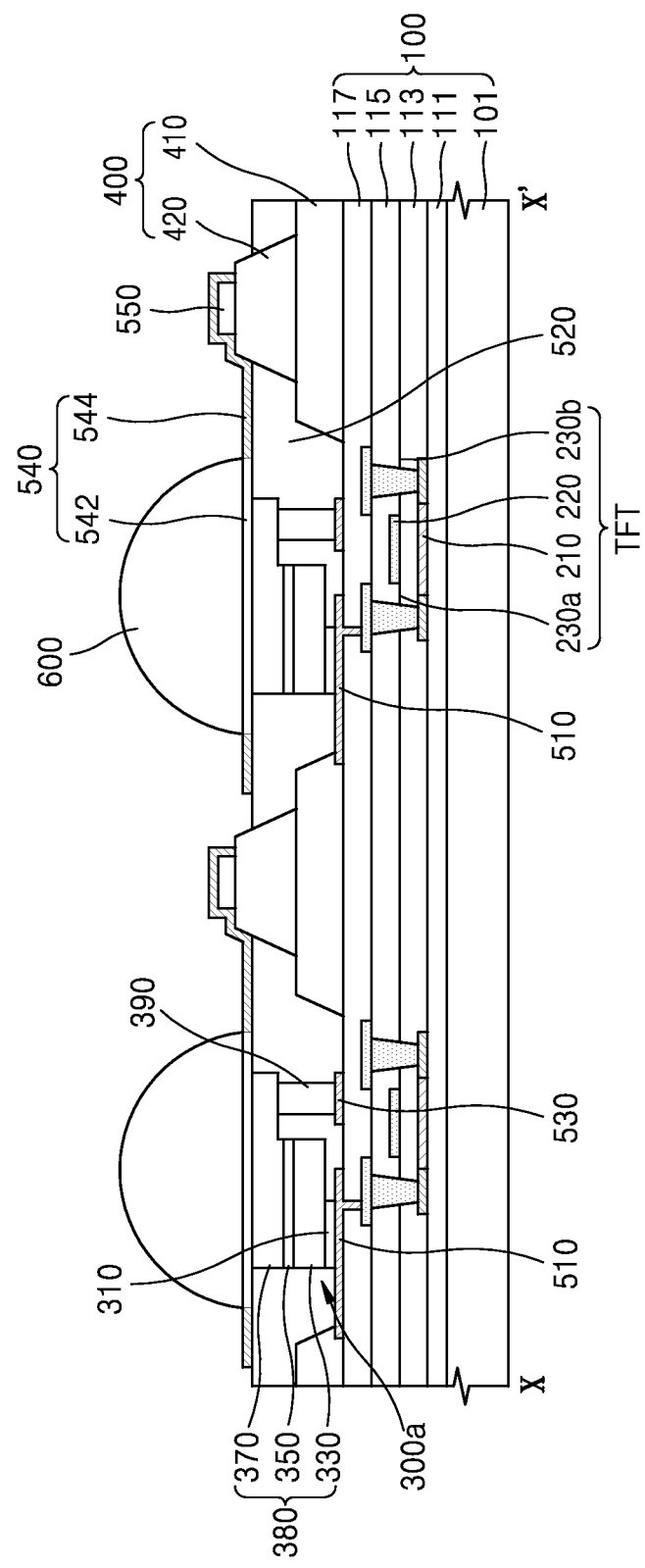
FIG. 7 is a cross-sectional view of a display apparatus according to an alternative embodiment.

FIG. 7 is a cross-sectional view of a display apparatus according to an alternative embodiment. The display apparatus illustrated in FIG. 7 is substantially the same as the display apparatus illustrated in FIG. 2, except that each of LEDs 300*a* is a horizontal-type LED. In such an embodiment, a second electrode 530 may be disposed below each of the LEDs 300*a*.

In an embodiment, a third electrode 540 may be disposed on the LED 300*a* and a passivation layer 520. The third electrode 540 may be divided into a first region 542 that overlaps a capping layer 600 and a second region 544 that does not overlap the capping layer 600.

The first region 542 and the second region 544 of the third electrode 540 may have different light characteristics. In one embodiment, for example, the first region 542 and the second region 544 may include the same atoms as each other, but the compositions of the same atoms of the first region 542 and the second region 544 are different from each other. The third electrode 540 may include metal atoms and oxygen atoms, and the specific gravity of the oxygen atoms included in the first region 542 may be different from the specific gravity of the oxygen atoms included in the second region 544. In one embodiment, for example, the specific gravity of the oxygen atoms included in the first region 542 may be greater than the specific gravity of the oxygen atoms included in the second region 544. Thus, in such an embodiment, the first region 542 may have light transmittance, and the second region 544 may have a light absorption property due to the nature of metal. The third electrode 540 may be an electrode for electrostatic discharge.

Figure 8A:
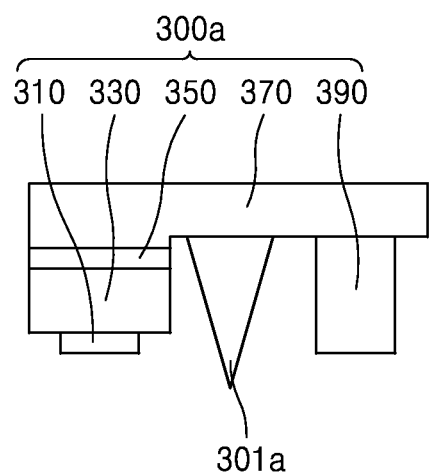
FIGS. 8A and 8B are cross-sectional views illustrating a light-emitting diode ("LED") including an insulating member according to another embodiment.
Figure 8B:
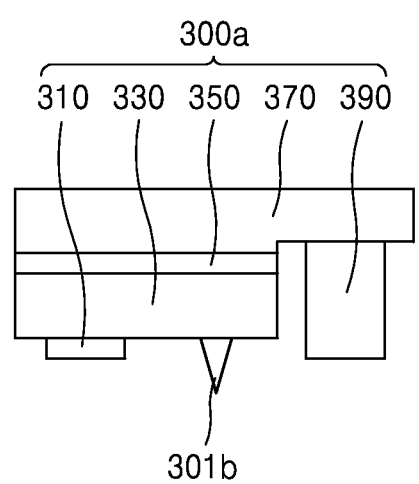

FIGS. 8A and 8B are cross-sectional views illustrating LEDs, each including an insulating member according to another alternative embodiment. In an embodiment, insulating member 301*a* or 301*b* may be disposed on the LED 300*a*. The insulating members 301*a* and 301*b* may protrude toward a display substrate 100.

In an embodiment, as illustrated in FIG. 8A, the insulating member 301*a* may be disposed on a second semiconductor layer 370, and an angle of a front end of the insulating member 301 may be reduced as being away from the second semiconductor layer 370, and a cross-section of the insulating member 301 may have a V-like shape. Alternatively, as illustrated in FIG. 8B, the insulating member 301*b* may be disposed on a first semiconductor layer 330, and an angle of a front end of the insulating member 301*b* may be reduced as being away from the first semiconductor layer 330, and a cross-section of the insulating member 301*b* may have a V-like shape. The configuration of the LED 300*a*, excluding the insulating members 301*a* or 301*b*, is substantially the same as that of the LED 300*a* illustrated in FIG. 7 and any repetitive detailed descriptions thereof will be omitted.

Figure 9:
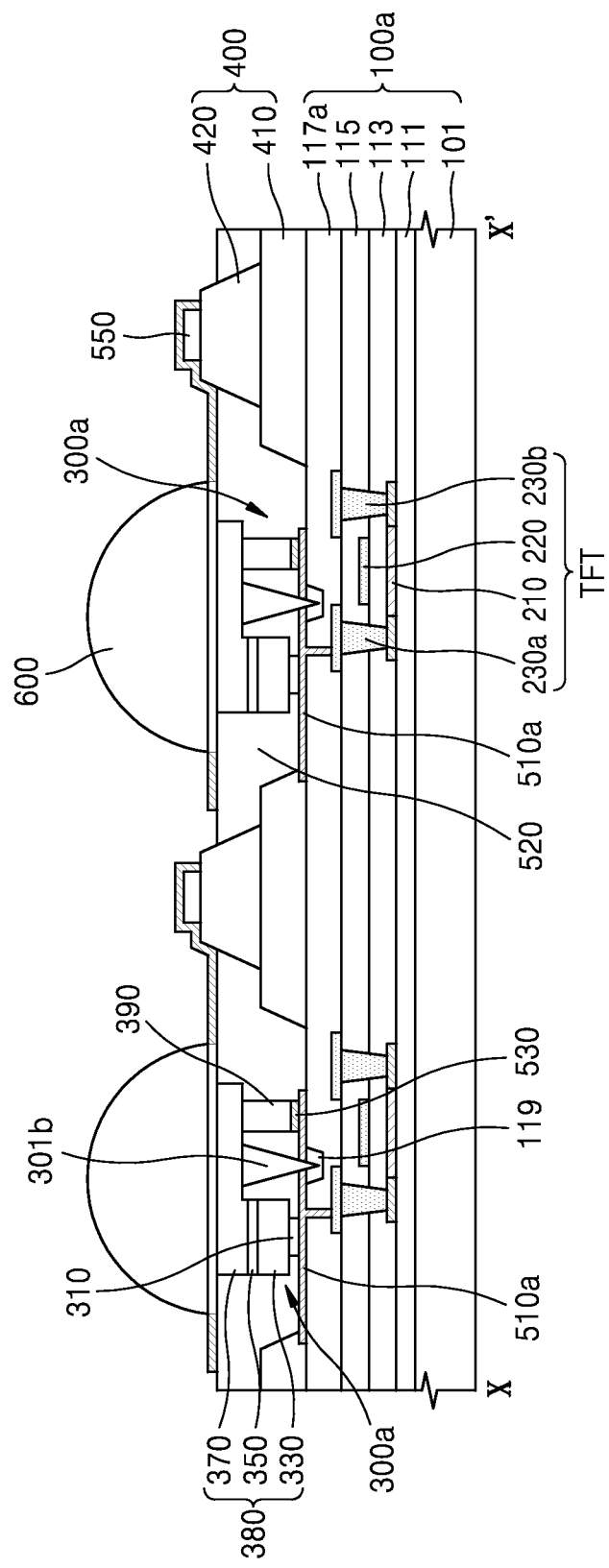
FIG. 9 is a view of a display apparatus including an LED on which the insulating member of FIG. 8B is disposed
Figure 10:
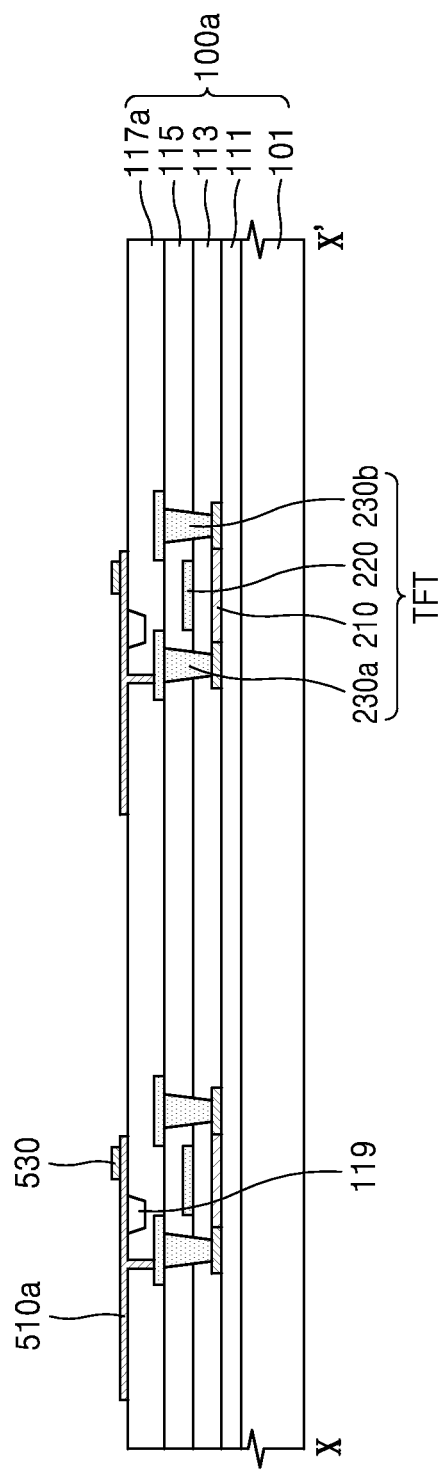
FIG. 10 is a view of a display substrate before an LED is mounted on the display substrate, according to another embodiment.

FIG. 9 is a view of a display apparatus including an LED 300*a* on which the insulating member 301*b* of FIG. 8B is disposed, and FIG. 10 is a view of a display substrate 100*a* before an LED is mounted on the display substrate 100*a*, according to another alternative embodiment. In an embodiment, as illustrated in FIGS. 9 and 10, the display substrate 100*a* may include a dent portion 119 having a dent region corresponding to the insulating member 301*b*. A first electrode 510*a* of the display substrate 100*a* before the LED 300*a* is mounted on the display substrate 100*a*, may be electrically connected to the TFT, may extend to the dent portion 119 and may contact a second electrode 530. A partial region of the first electrode 510*a* may be disposed on the dent portion 119.

In an embodiment, when the LED 300*a* is mounted on the display substrate 100*a*, the insulating member 301*b* may be disposed in the dent portion 119 while penetrating the first electrode 510a. The first and second contact electrodes 310 and 390 may contact the first and second electrodes 510a and 530.

The insulating member 301a or 301b may be used to check whether the LED 300a is properly mounted on the display substrate 100a, in real-time. In one embodiment, for example, because the first and second electrodes 510a and 530 of the display substrate 100a are shorted, a constant voltage may be applied to the display substrate 100a. When the LED 300a having the insulating member 301b disposed thereon in a state in which the constant voltage is applied to the display substrate 100a, is mounted on the display substrate 100a, the insulating member 301b may cut the first electrode 510a. Then, a region of the first electrode 510a connected to a TFT and the second electrode 530 may be open. Due to the open first electrode 510a and second electrode 530, it may be checked that the LED 300a is properly mounted on the display substrate 100a.

Figure 11:
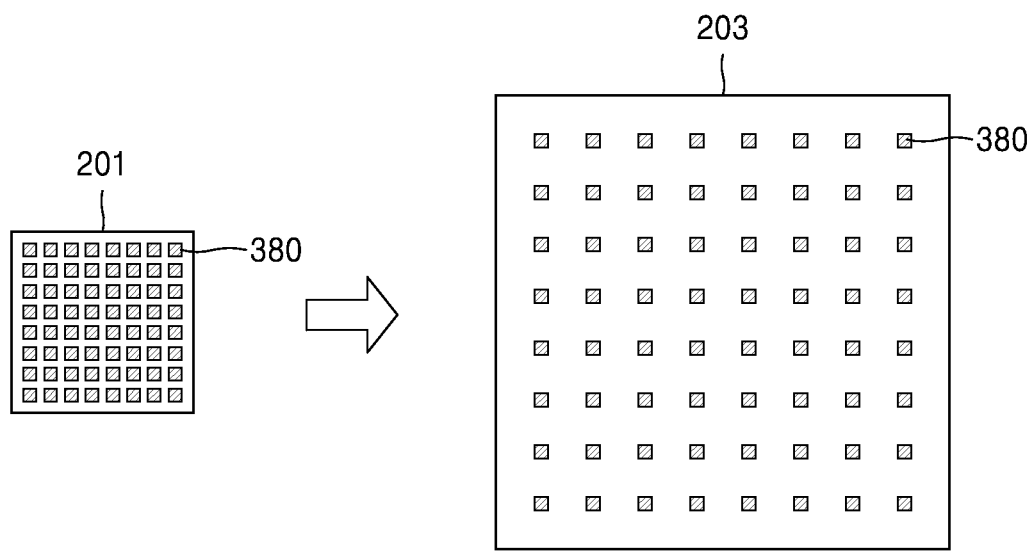
FIG. 11 is a view schematically illustrating part of a method of manufacturing a display apparatus, according to an embodiment.

FIG. 11 is a view schematically illustrating part of a method of manufacturing a display apparatus.

As shown in FIG. 11, a plurality of the p-n diodes 380 may be formed on a base substrate 201. The base substrate 201 may be a conductive substrate or an insulating substrate, and may include or be formed of at least one material selected from among, for example, sapphire ($Al_2O_3$), SiC, silicon (Si), GaAs, GaN, ZnO, GaP, InP, germanium (Ge), and $Ga_2O_3$.

Each of the plurality of p-n diodes 380 may include the first semiconductor layer 330 (see FIG. 2), the second semiconductor layer 370 (see FIG. 2), and the intermediate layer 350 (see FIG. 2) disposed between the first semiconductor layer 330 and the second semiconductor layer 370. Each of the first semiconductor layer 330, the intermediate layer 350, and the second semiconductor layer 370 may be formed by metal organic chemical vapor deposition ("MOCVD"), chemical vapor deposition ("CVD"), plasma-enhanced chemical vapor deposition ("PECVD"), molecular beam epitaxy ("MBE"), or hydride vapor phase epitaxy ("HVPE"). The plurality of p-n diodes 380 formed on the base substrate 201 are separated from the base substrate 201 and are arranged on a carrier substrate 203 to be spaced apart from one another.

The first contact electrode 310 may be formed or formed on each of the plurality of p-n diodes 380. The first contact electrode 310 may include at least one layer, and may be formed of at least one of various conductive materials including metal, a conductive oxide, and conductive polymers. Although each LED 300 is formed by forming the first contact electrode 310 on the p-n diode 380 in FIG. 11, the embodiment is not limited thereto. Alternatively, the second contact electrode 390, the p-n diode 380, and the first contact electrode 310 may be sequentially formed on the carrier substrate 203.

A single LED 300 or a plurality of the LEDs 300 may be picked up from the carrier substrate 203 and may be transferred to the display substrate 100 by a transfer apparatus.

In the method of manufacturing the display apparatus 10 according to an embodiment, some of a plurality of LEDs disposed on a carrier substrate may be selectively adhered to a display substrate. In such an embodiment, a sacrificial layer and laser may be used to allow the LEDs to selectively adhere to the display substrate.

Figure 12A:
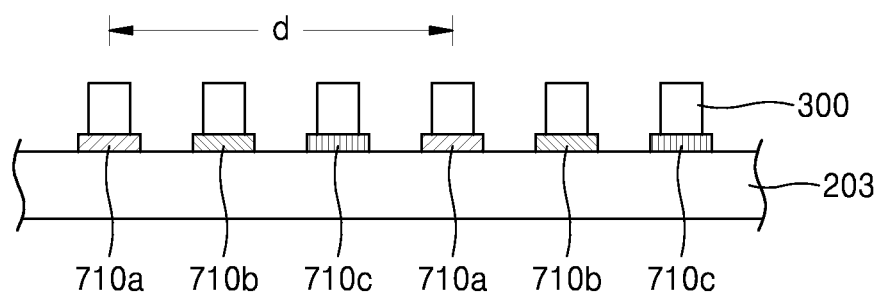
FIGS. 12A through 12C are views schematically illustrating a part of the method of manufacturing a display apparatus, illustrated in FIG. 11.
Figure 12B:
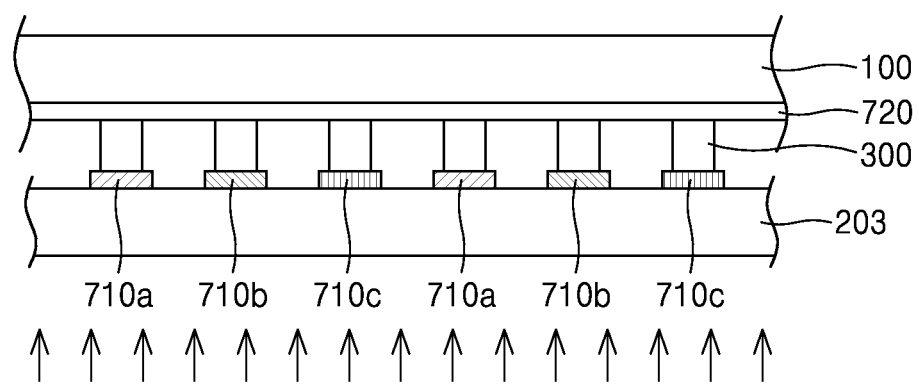
Figure 12C:
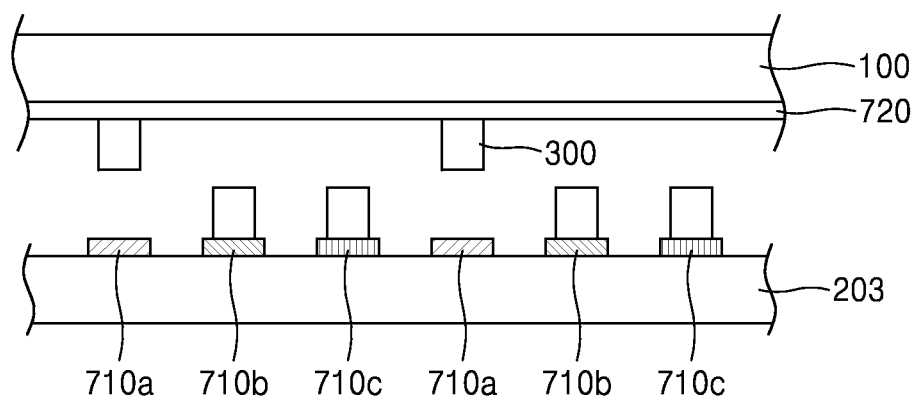

FIGS. 12A through 12C are views schematically illustrating a part of the method of manufacturing the display apparatus illustrated in FIG. 11.

As illustrated in FIG. 12A, a plurality of sacrificial layers having different absorption coefficients with respect to laser are disposed on a carrier substrate 203. In one embodiment, for example, a first sacrificial layer 710a having a first absorption coefficient, a second sacrificial layer 710b having a second absorption coefficient, and a third sacrificial layer 710c having a third absorption coefficient may be sequentially disposed to be spaced apart from one another. An LED 300 may be disposed on each of the first through third sacrificial layers 710a, 710b, and 710c. The first through third sacrificial layers 710a, 710b, and 710c may include carbon or a graphite material, for example.

A distance between the first sacrificial layers 710a may be the same as a distance between pixels that emit the same light colors. The first through third sacrificial layers 710a, 710b, and 710c may be formed before each of the LEDs 300 is disposed on the carrier substrate 203.

A display substrate 100 may be disposed on the carrier substrate 203 in a state in which the LEDs 300 are disposed between the display substrate 100 and the carrier substrate 203. An adhesion layer 720, to which each of the LEDs 300 may be adhered, may be disposed on the display substrate 100. The adhesion layer 720 may include acryl or resin, for example. The display substrate 100 may contact each of the LEDs 300.

In an embodiment, first laser may be irradiated through a bottoms surface of the carrier substrate 203. The first sacrificial layer 710a is melted by absorbing the first laser, whereas the second and third sacrificial layers 710b and 710c may not be melted due to low absorptance with respect to the first laser. Each of the LEDs 300 disposed on the first sacrificial layer 710a after the first sacrificial layer 710a is melted, may be detached from the carrier substrate 203 and may be adhered to the display substrate 100.

Through the above-described method, LEDs disposed on a carrier substrate may be selectively adhered to a display substrate using sacrificial layers.

Figure 13:
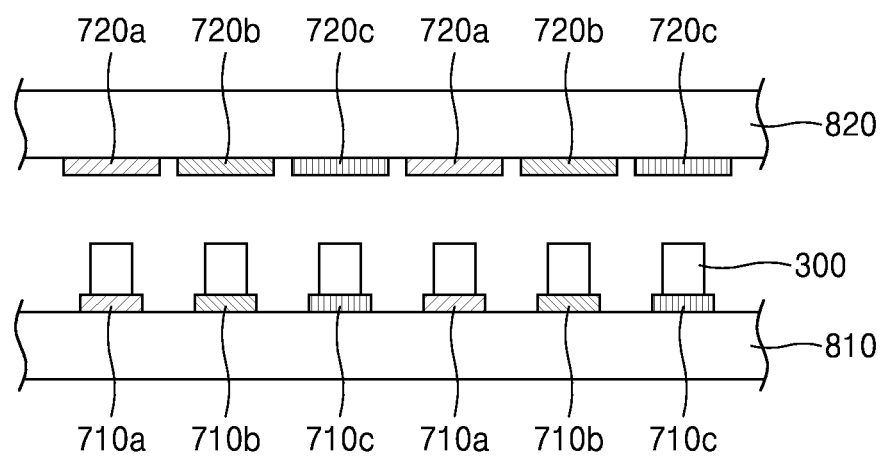
FIG. 13 is a view schematically illustrating a part of a method of manufacturing a display apparatus, according to another embodiment.

FIG. 13 is a view schematically illustrating a part of a method of manufacturing a display apparatus, according to an alternative embodiment.

In an alternative embodiment, as illustrated in FIG. 13, a plurality of sacrificial layers 710a, 710b, and 710c are disposed on a first substrate 810 to be spaced apart from one another, and each of LEDs 300 may be disposed on each of the plurality of sacrificial layers 710a, 710b, and 710c. In such an embodiment, the first substrate 810 may be a carrier substrate, and embodiments are not limited thereto. A second substrate 820 may be disposed on the first substrate 810 in a state in which each of the LEDs 300 is disposed between the second substrate 820 and the first substrate 810. An adhesion layer may be disposed on the second substrate 820 and may be cured by laser. In one embodiment, for example, a first adhesion layer 720a may be disposed in a region of the second substrate 820 corresponding to the first sacrificial layer 710a, and a second adhesion layer 720b may be disposed in a region of the second substrate 820 corresponding to the second sacrificial layer 710b, and a third adhesion layer 720c may be disposed in a region of the second substrate 820 corresponding to the third sacrificial layer 710c. The first through third adhesion layers 720a, 720b, and 720c may have different absorption coefficients with respect to laser and may include a material to be cured by absorbed laser.

In one embodiment, for example, the first adhesion layer 720a may include a material having a first absorption coefficient, and the second adhesion layer 720b may include a material having a second absorption coefficient, and the third adhesion layer 720c may include a material having a third absorption coefficient. The length of each of the first through third adhesion layers 720*a*, 720*b*, and 720*c* may be greater than that of each of the first through third sacrificial layers 710*a*, 710*b*, and 710*c*. Then, when first laser is irradiated through the first substrate 810, the first sacrificial layer 710*a* is melted, whereas the first adhesion layer 720*a* may be cured. Then, each of the LEDs 300 disposed on the first sacrificial layer 710*a* is adhered to the first adhesion layer 720*a* of the second substrate 820, whereas, as edges of the first adhesion layer 720*a* are cured, each of the LEDs 300 may be more firmly adhered to the first adhesion layer 720*a*.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a display substrate;
    a light-emitting diode disposed on the display substrate, wherein the light-emitting diode emits light;
    a passivation layer disposed on the display substrate and surrounding the light-emitting diode;
    a first conductive layer disposed on the light-emitting diode and the passivation layer; and
    a capping layer disposed on the light-emitting diode, wherein the capping layer adjusts a proceeding path of light emitted from the light-emitting diode, wherein
    the first conductive layer comprises a first region which overlaps the capping layer and a second region which does not overlap the capping layer, and
    the first region and the second region of the first conductive layer have different light characteristics from each other.

2. The display apparatus of claim 1, wherein the first region and the second region comprise metal atoms and oxygen atoms.

3. The display apparatus of claim 1, wherein
    the first region and the second region comprise same atoms as each other, and
    compositions of the same atoms of the first region and the second region are different from each other.

4. The display apparatus of claim 2, wherein a specific gravity of the oxygen atoms included in the first region is different from a specific gravity of the oxygen atoms included in the second region.

5. The display apparatus of claim 2, wherein a specific gravity of the oxygen atoms included in the first region is greater than a specific gravity of the oxygen atoms included in the second region.

6. The display apparatus of claim 1, wherein incident light is absorbed in the second region.

7. The display apparatus of claim 1, wherein incident light is transmitted through the first region.

8. The display apparatus of claim 1, wherein the first conductive layer is an electrode which applies an electrical signal to the light-emitting diode.

9. The display apparatus of claim 1, wherein the capping layer has a lens shape.

10. The display apparatus of claim 1, further comprising:
    an insulating member contacting the light-emitting diode and protruding toward the display substrate.

11. The display apparatus of claim 10, wherein the display substrate comprises a dent portion having a dent region corresponding to the insulating member.

12. The display apparatus of claim 11, further comprising:
    a second conductive layer disposed on the display substrate,
    wherein the second conductive layer is cut by the insulating member.

13. The display apparatus of claim 12, wherein a partial region of the second conductive layer is disposed on the dent portion.

14. The display apparatus of claim 12, wherein the light-emitting diode further comprises an electrode pad spaced apart from the insulating member.

15. The display apparatus of claim 14, wherein the second conductive layer contacts the electrode pad.

16. The display apparatus of claim 14, wherein the light-emitting diode comprises a P—N diode, and the insulating member contacts a partial region of the P—N diode.

* * * * *